United States Patent [19]

Eltoukhy

[11] Patent Number: 4,697,974
[45] Date of Patent: Oct. 6, 1987

[54] PALLET-LOADING SYSTEM

[75] Inventor: Atef Eltoukhy, San Jose, Calif.

[73] Assignee: Trimedia Corporation, Fremont, Calif.

[21] Appl. No.: 821,989

[22] Filed: Jan. 24, 1986

[51] Int. Cl.4 .......................................... B65G 67/02
[52] U.S. Cl. .................................... 414/331; 118/500; 118/729; 414/396; 414/401; 414/498; 414/572
[58] Field of Search ................ 118/500, 729; 414/222, 414/331, 352, 353, 498, 392, 395, 396, 572, 400, 401

[56] References Cited

U.S. PATENT DOCUMENTS 3,869,052  3/1975  Leahy .............................. 414/498 X Primary Examiner—Robert J. Spar
Assistant Examiner—Stuart J. Millman
Attorney, Agent, or Firm—Ciotti, Murashige, Irell & Manella

[57] ABSTRACT

A rapid-load system for loading a series of pallets into a sputtering apparatus. The system comprises a magazine having a plurality of vertically spaced pallet supports whose spacing is sufficient to allow insertion of a pallet into the magazine directly without contact between the pallet and magazine. The magazine is removably supported in a load-in chamber of the sputtering apparatus by a chamber track assembly. A movable loading cart in the system includes a shiftable carriage for moving a pallet supported on the carriage between loading and stacking positions, and a magazine track assembly on which the magazine can be vertically shifted to each of a series of insertion positions, at which a pallet can be moved on the carriage into a position between vertically adjacent magazine supports, without contact between the pallet and supports, and corresponding release positions, at which weight support for the pallet is transferred from the carriage to the magazine transfer track assembly for transferring the magazine from the support track assembly on the cart to the chamber track assembly within the load-in chamber with the cart position adjacent the load-in chamber.

7 Claims, 8 Drawing Figures

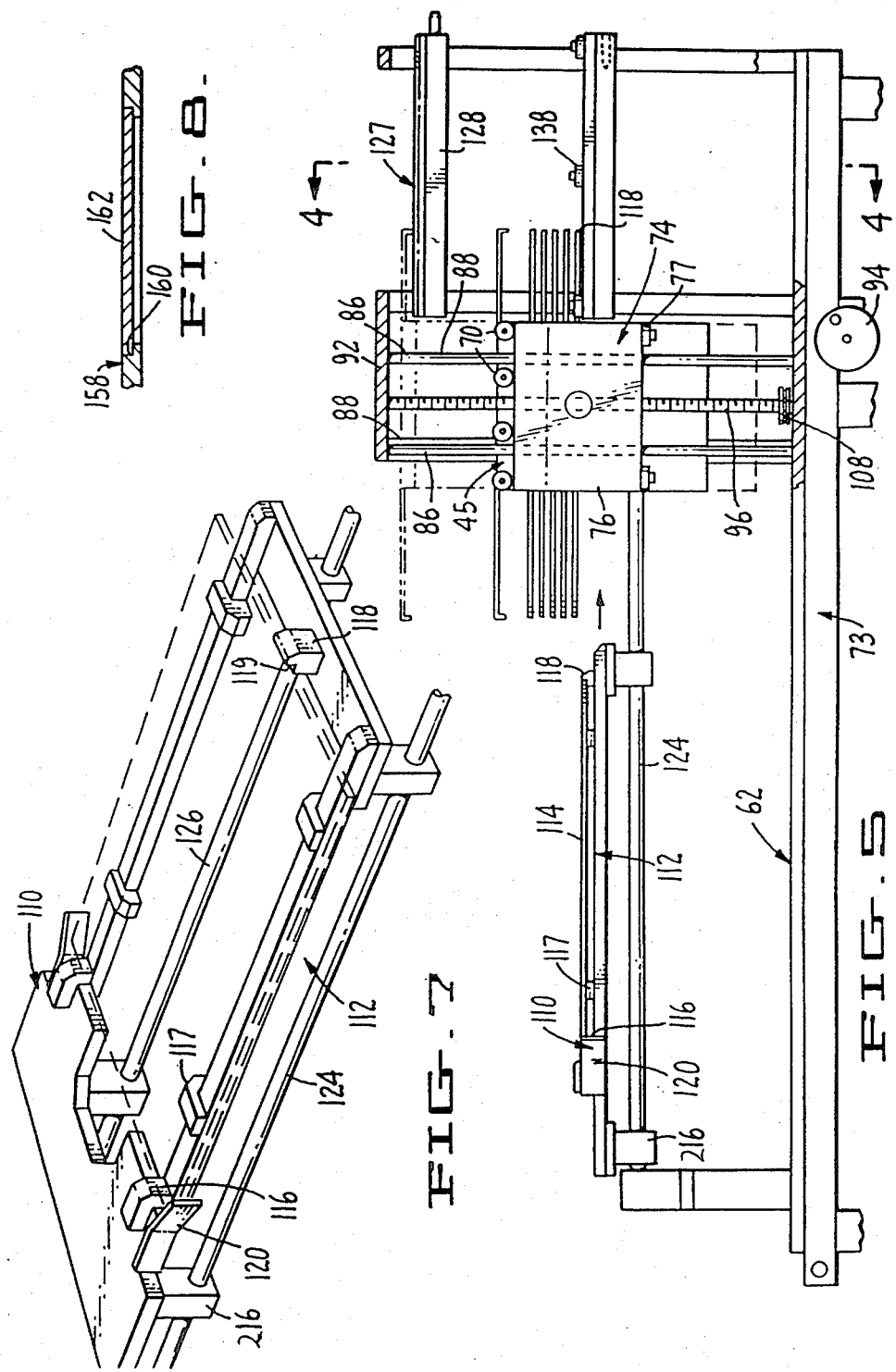

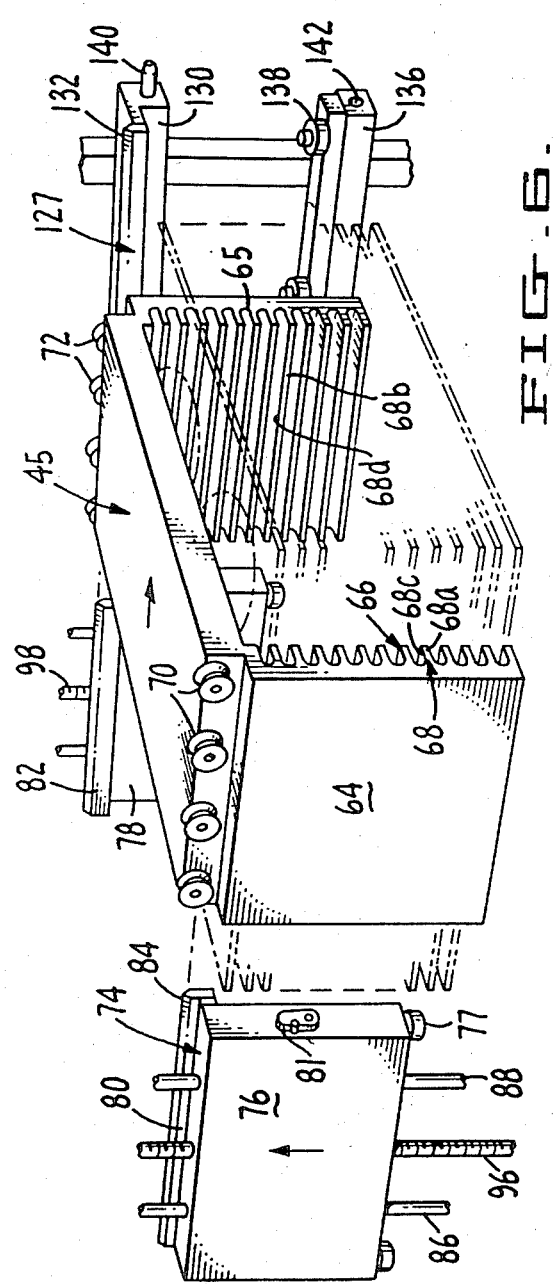

PALLET-LOADING SYSTEM

FIELD OF THE INVENTION

The present invention relates to a rapid-load system for loading pallets in a sputtering apparatus or the like.

BACKGROUND OF THE INVENTION

Sputtering, referring to vapor deposition of an ion-bombarded target metal to form a thin film on a substrate, is widely used in the electronics industry. Thin-film magnetic recording disks, for example, are advantageously formed by sputtering successive thin-film layers, including an outer magnetic thin film, on a suitable disk-like substrate. Thin-film sputtering may be used in preparing optical recording medium and in semiconductor fabrication, for producing metal conductive layers on a silicon substrate.

The usual sputtering apparatus consists of a front load-in chamber, one or more sputtering stations at which thin-film layers are deposited on a substrate as the substrate passes through the station(s), and a load-out chamber at the opposite end of the apparatus. Housed in each load chamber is a vertically shiftable magazine constructed for holding a plurality of stacked pallets.

In operation, the apparatus, including the two end chambers, is sealed and evacuated, e.g., to a working vacuum of about $10^{-7}$ Torr or less, and the load-in magazine is lowered to place the lowermost pallet on the magazine onto a conveyor which conveys that pallet through the sputtering station(s) and onto the magazine in the load-out chamber. The two magazines are operated to transfer the vertically stacked pallets successively onto the conveyor, in a bottom-to-top direction in the load-in chamber, and in a top-to-bottom direction in the load-out chamber. After all the pallets have been processed, the apparatus is opened, the pallets removed from the load-out chamber, and a series of fresh substrate-supporting pallets stacked on the magazine in the load-in chamber.

Heretofore, loading and unloading the pallets from a plating apparatus of this type has required inserting the pallets individually into the load-in magazine, and similarly removing the processed pallets individually from the load-out magazine. Transferring pallets to and from the apparatus chambers in this manner is relatively time-consuming, and the loading and unloading time can also lead to significant moisture accumulation in the entire system, requiring longer pump-down times to achieve the desired operational vacuum. Typically, the loading, unloading, and pump-down steps require between 1 and 2 hours for an apparatus in which the total sputtering operation cycle is only about 2 hours. That is, the loading and unloading operation can reduce the total operational time of the apparatus by at least about 50%. Given the high cost of sputtering machines, this lost time represents a serious additional cost in lost production and/or additional machine investment.

Another limitation of the above pallet-loading and unloading procedure is that, in sliding the trays into or out of the magazines, frictional contact between the edges of the pallets and the supporting surfaces of the magazines generates metal particles which get drawn into the apparatus during pump down. These particles, when deposited on the substrates during sputtering, seriously compromise the quality of the resulting sputtered medium, usually requiring that the contaminated medium be discarded.

SUMMARY OF THE INVENTION

It is therefore a general object of the present invention to provide, for use with a sputtering apparatus of the type described above, a pallet-loading system which substantially overcomes above-discussed limitations and problems associated with the prior art.

A more specific object of the invention is to provide such a system which allows rapid loading and unloading of pallets in such a sputtering system.

A related object of the invention is to increase the total output of such a sputtering machine substantially.

Still another object of the invention is to provide such a system which substantially eliminates frictional metal contact during pallet loading and unloading procedures, and thereby reduces the problems associated with metal debris contamination in a sputtering apparatus.

The invention includes a rapid-load system for loading pallets into a plating apparatus, such as a sputtering apparatus, of the type described above. The system includes a magazine having a plurality of vertically spaced pallet supports, where each support is formed of a pair of confronting, inwardly projecting support faces carried on the opposite side walls of the magazine, for engaging opposite side edges of a pallet. The space immediately above each support is sufficient to allow insertion of a pallet into the magazine directly above the support, without contact between the pallet and the pallet support. The magazine is removably supported within the load-in chamber of the plating apparatus by chamber support structure in the system.

A movable loading cart in the system includes (a) a shiftable carriage adapted to move a pallet supported on the carriage between loading and stacking positions, (b) support means for supporting the magazine on the cart, (c) means for shifting the support means vertically with respect to the carriage, to place the magazine carried on the support means at each of a series of insertion positions where a pallet supported on the carriage can be received in the space immediately above a selected pallet support, without contact between the tray and the magazine, as the carriage is shifted from its loading to its stacking position, and a corresponding pick-up position, where the inserted tray is raised with respect to the magazine to transfer support of the tray from the carriage to that support, and (d) transfer means for transferring the magazine from the support means on the cart to the support structure within the load-in chamber with the cart positioned adjacent the load-in chamber.

In a loading operation, a pallet is placed on the carriage, with such in its loading position, and the support means is shifted vertically to place the magazine carried on the support means at a selected insertion position. The carriage is then shifted from its loading to its stacking position to insert in pallet, in a contact-free manner, between supports in the magazine, and the magazine is raised to its corresponding pick-up position, transferring the pallet from the carriage to a magazine pallet support. This process is repeated until the magazine is loaded. The loaded magazine is then moved by transfer means in the cart from the cart to the load-in chamber, with the cart placed adjacent the load-in chamber.

In a preferred embodiment of the invention, the support structure includes a support track assembly mounted within the load-in chamber, and the transfer means includes a transfer track assembly mounted on the cart. The two track assemblies are alignable, when the magazine is positioned adjacent the load-in chamber. The embodiment also includes rollers on which the magazine can be rolled from one track assembly to another.

Where the plating apparatus also has a load-out chamber for storing pallets in a vertical stack after plating, the system may further include support structure within the load-out chamber, for removably supporting a magazine of the type described above, and a second movable cart having a track assembly which is alignable with the support structure in the load-out chamber, for receiving the loaded magazine from the load-out chamber.

These and other objects and features of the present invention will become more fully apparent when the following detailed description of the invention is read in conjunction with the accompanying drawings.

BRIEF DESCRIPTION OF THE DRAWINGS

FIG. 5 is an enlarged side view of the movable cart shown at the lower left in FIG. 1;

FIG. 6 is an enlarged perspective view of a magazine and magazine transfer assembly seen in the loading cart in FIG. 1;

FIG. 7 is an enlarged perspective view of the carriage seen at the left in FIG. 5, but shown here without a pallet; and FIG. 8 is an enlarged sectional view taken along line 8—8 in FIG. 1, and showing a substrate carried on a pallet.

DETAILED DESCRIPTION OF THE INVENTION

Figure 1:
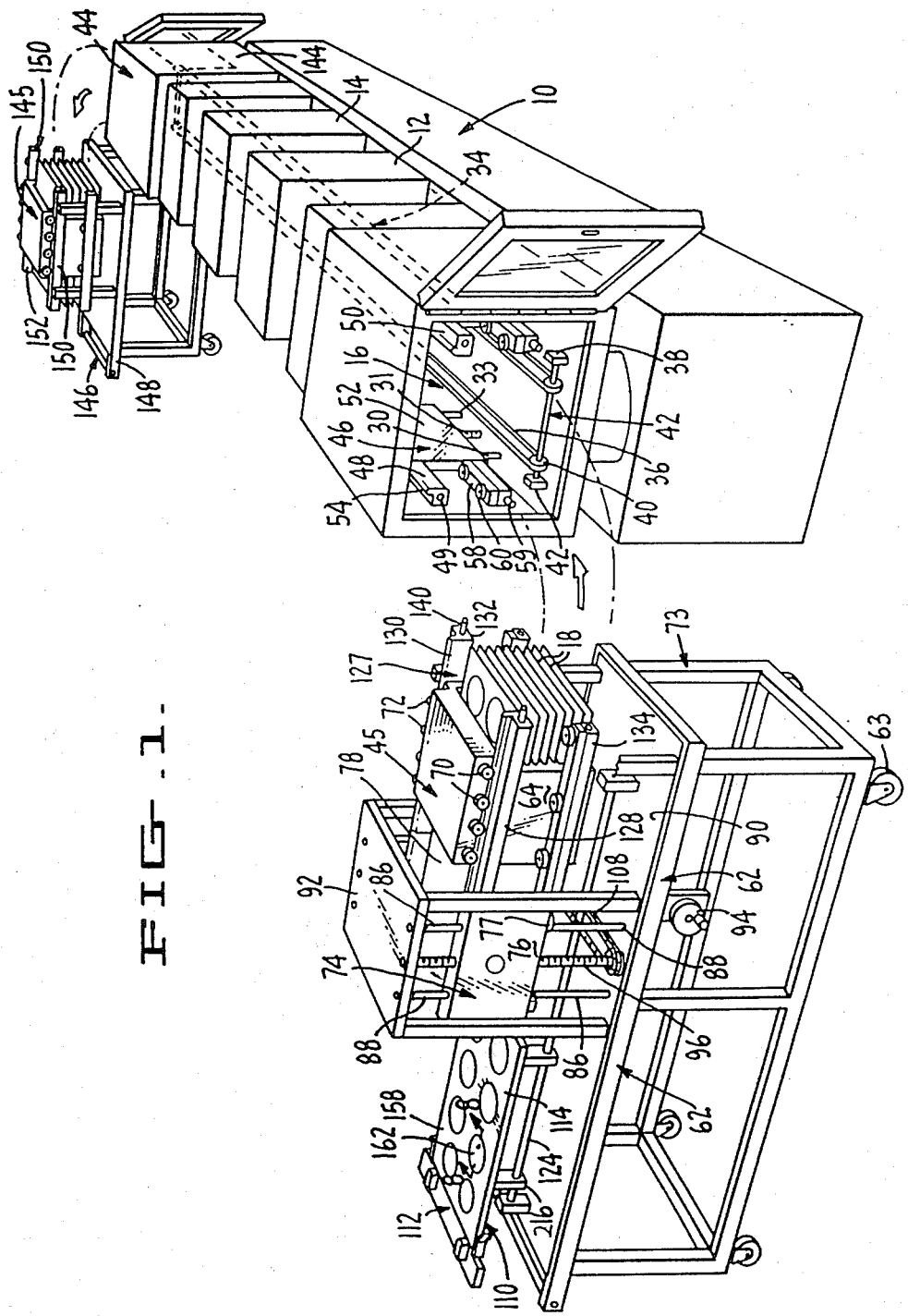
FIG. 1 is a perspective view of the tray-loading system of the present invention, and a sputtering apparatus with which the system interacts.

The tray-loading system of the present invention, and a plating apparatus which is designed to be loaded and unloaded by the system, are illustrated in FIG. 1. The particular plating apparatus illustrated herein is a sputtering apparatus 10 which is designed to sputter one or more thin layers on one or both sides of substrates, as these are moved through the apparatus in a front-to-back direction in the figure. Apparatus 10 typically consists of a series of sputtering stations, such as stations 12, 14, at which successive thin films are deposited on a substrate. For example, when the apparatus is used in forming a thin-film magnetic medium, station 12 may function to deposit an underlayer on one or both sides of a substrate, and the more downstream station 14 may function to deposit a magnetic recording film on the substrate underlayer. Apparatus 10 is preferably a commercially available double-sided, in-line, high-throughput sputtering machine, such as may be obtained from Circuits Processing Apparatus (Fremont, CA). Co-owned U.S. patent application, Ser. No. 672,595, filed 15 Nov. 1984, now abandoned, describes a hard-disk magnetic recording medium formed in a sputtering system of this type. Co-owned U.S. patent application Ser. No. 706,737, filed 27 Feb. 1985, now U.S. Pat. No. 4,604,179, describes a novel baffling system used in the apparatus for reducing crystal anisotropy in the sputtered film layers.

Figures 2, 3:
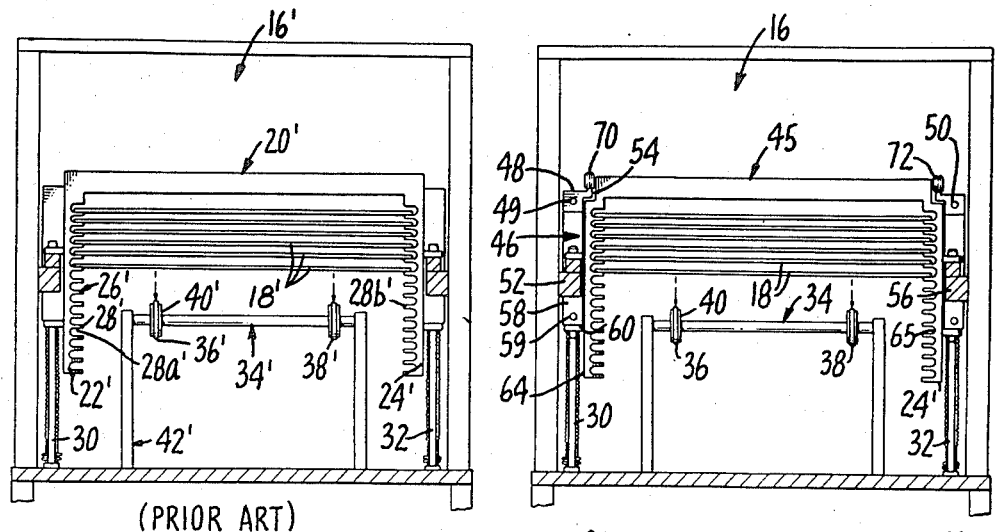
FIG. 2 is a front-on view of a load-in chamber of the sputtering apparatus, before modification of the chamber according to the present invention.
FIG. 3 is a front-on view of the load-in chamber seen in FIG. 2, after modification to include a magazine-support structure which forms part of the tray-load system of the present invention, and shown here with a magazine removably inserted in the chamber.

With continued reference to FIG. 1, apparatus 10 includes a load-in chamber 16 which receives a vertical stack of trays or pallets, such as pallets 18, which will be processed in the apparatus. In describing the load-in chamber, reference will be made both to FIG. 2, which shows the chamber as it is conventionally constructed, i.e., as the apparatus is received from the manufacturer, and to FIG. 3, which shows the chamber after modification according to the present invention. For the sake of clarity, parts of the load-in chamber in the conventional apparatus (FIG. 2) will be indicated by "primed" numbers which correspond, where applicable, to those in the modified apparatus (FIG. 3). Thus, for example, load-in chamber 16 in FIG. 3 is designated 16' in FIG. 2.

Considering first the construction of load-in chamber 16' in the conventional apparatus, there is provided a magazine 20' for holding a series of vertically stacked pallets, such as pallets 18', which are to be fed through the apparatus during sputtering operation. Magazine 20', which has an inverted U-shaped construction, includes a pair of opposed side walls 22', 24', whose inner, confronting sides define a plurality of vertically spaced pallet supports, such as supports 26', 28'. Each tray support is formed of a pair of confronting, inwardly facing wall projections, such as projections 28a' and 28b' forming support 28'.

Magazine 20' is mounted through its side walls on a series of worm screws, such as worm screw 30' operatively connected to side wall 22' and worm screw 32' connected to side wall 24'. Typically, each wall is carried on three worm screws, as seen in FIG. 1, where the worm screws which perform an analogous function in load-in chamber 16 are indicated at 30, 31, and 33. The screws are coordinately driven by a suitable driving mechanism to raise and lower the magazine during operation of the apparatus.

Also contained in the load-in chamber is the upstream end of a pallet-conveyor system 34'. The system includes a pair of conveyor belts 36', 38' which are coordinately driven in a front-to-back direction through the apparatus to carry a pallet supported on the belts through the sputtering stations in the apparatus and into a load-out chamber 44 (FIG. 1) in the apparatus. The conveyor belts are supported on a pair of wheels, such as wheel 40', which are carried on a conveyor support 42'. The conveyor system is seen best in FIG. 1, where the same conveyor system in chamber 16 is indicated by corresponding unprimed numbers.

In operation of the conventional (unmodified) apparatus, a plurality of pallets, each holding one or more substrates, are individually loaded into magazine 20', by sliding each pallet onto a pallet support in the magazine. The magazine is initially raised by the worm drive mechanism to position the lowermost tray in the magazine above the conveyor belts. After sealing and evacuating the apparatus, including both load-in and load-out chambers, the load-in magazine is lowered by the worm drive mechanism to deposit the pallets successively in a bottom-to-top direction, onto the conveyor system. The individual pallets are carried through the sputtering stations and into load-out chamber 44. As each pallet is moved into the load-out chamber 44, the pallet is transferred to a load-out magazine whose vertical position is also controlled by a worm drive mechanism. The pallets are transferred to the load-out magazine successively in this manner, in a top-to-bottom direction, until the sputtering cycle is completed, and all of the trays have been transferred from the load-in to the load-out magazine. The load-out chamber is then opened, and the plates individually removed from the magazine.

In the tray-loading system of the invention, magazine 20' in the conventional apparatus is replaced by a removable magazine 45 and chamber support structure for supporting the magazine removably in chamber 16. The support structure, which is indicated generally at 46 in FIG. 1 and 3, includes a pair of tracks 48, 50, which extend along opposite upper side of the chamber, in a front-to-back directions, as seen in FIG. 1. Track 48, which is representative, has an upper beveled track edge 54 for movement of a grooved wheel on the magazine along the track. As seen best in FIG. 1, track 48 is carried on a track plate 52, and this plate is threadedly mounted on worm screws 30, 31, 33, as shown, for vertical track shifting. Also mounted on plate 52 is a guide bar 58 having a pair of rotatable wheels, such as wheel 60, which function to stabilize the magazine, as the same is moved along tracks 48, 50 into chamber 16. Track 50 is similarly constructed and mounted on a track plate for coordinate vertical shifting with track 48. The two tracks are provided with front openings, such as opening 49 in track 48, and the guide bars, with front pins, such as pin 59 in guide bar 58, for a purpose to be described.

The just-described magazine support structure, including tracks 48, 50, and the associated track plates and guide bars, is also referred to herein collectively as a chamber track assembly. The track assembly and the removable magazine supported thereon which replace the magazine 20' in the unmodified apparatus are part of the pallet-loading system of the invention, rather than part of apparatus 10. The track assembly is readily interchanged with the original magazine by suitably constructing the track assembly, and particularly the track plates therein, for receipt on and movement by the worm screws.

Figure 4:
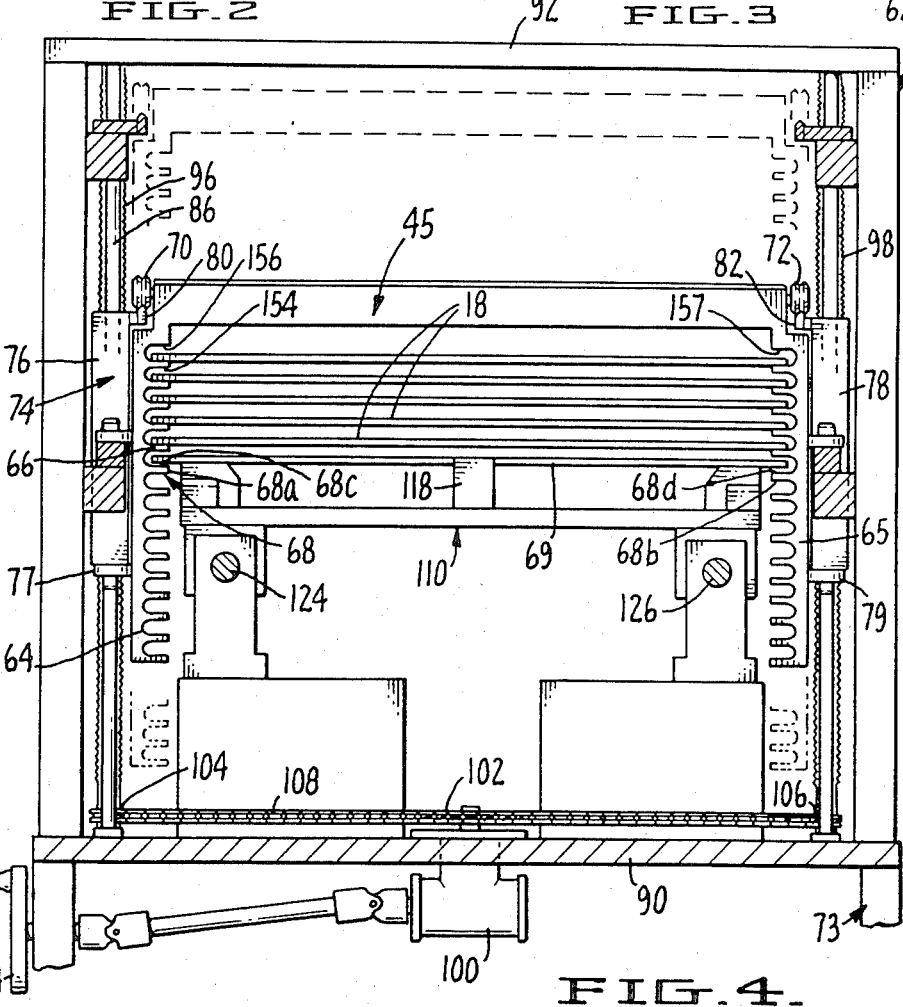
FIG. 4 is an enlarged front-on view of an upper portion of the loading cart as viewed along line 4—4 in FIG. 5.

According to an important feature of the invention, magazine 45 in the system is designed to be shuttled between a movable cart 62, having casters, such as caster 63, and the load-in chamber of the apparatus, where the pallets are processed in apparatus 10, as described. The magazine is shown carried on cart 62 in FIGS. 1, 4, 5, and 6 inserted in the load-in chamber of apparatus 10 in FIG. 3. With reference to these figures, and particularly to FIG. 4, magazine 45 has an inverted U-shaped structure similar to that of magazine 20', and is composed of a pair of opposed side walls 64, 65. Formed on the side walls are a plurality of vertically spaced pallet supports, such as supports 66, 68. Each support is formed of a pair of confronting, inwardly facing, elongate wall projections, such as projections 68a, 68b forming support 68. The projections forming each tray support define upper, elongate support surfaces such as surface 68c of projection 68a, and surface 68d of projection 68b, on which a pallet, such as pallet 69, is supported. As seen in FIG. 4, the spacing between adjacent projections, such as those forming supports 66, 68, is greater than the thickness of the pallet designed to be carried on the magazine. This allows a pallet to be inserted into the magazine between a pair of adjacent supports, such as supports 66, 68, without frictional contact with either support, in a pallet-loading operation which will be described further below. Also as seen, the width of a pallet is less than the distance between the inner surfaces of sidewalls 65, 65, so that frictional contact between the pallet edges and the walls of the magazine is avoided during pallet loading.

Magazine 45 also has grooved wheels, such as wheels 70, 72 mounted along the upper side wall edges as seen in FIGS. 1 and 6. These wheels are positioned to engage and ride on the track edges in the track assembly in the load-in chamber, and on similar track assemblies in the cart, to be described. The wheels are also referred to herein as roller means.

The magazine is supported on the cart by a magazine track assembly 74 mounted on a frame 73 of the cart, as illustrated particularly in FIGS. 1 and 5. Assembly 74 is formed of a pair of opposed plates 76, 78, and, mounted along the upper inner edges of these plates, a pair of tracks 80, 82, respectively (FIG. 6). The tracks have upper beveled edges, such as edge 84 of track 80, on which the grooved wheels of magazine 45 ride, as seen in FIG. 4. Plates 76, 78 are also provided with rotatable guide wheels, such as wheels 77, 79 (FIG. 4), which serve to guide the magazine, in a side-to-side direction, as it is being moved onto or off tracks 80, 82. A closure hook 81 swingably carried on the front face of plate 76 (FIG. 6) is used to clamp the magazine in place on the magazine track assembly during pallet loading.

Each of plates 76, 78 is mounted on frame 73 for vertical shifting with respect thereto, by a pair of vertical tubes, such as tubes 86, 88 mounting plate 76. The tubes, in turn, are mounted on the frame between a lower frame member 90, and a roof member 92 attached to member 90 as shown in FIG. 1. The magazine track assembly just described is also referred to herein as means for supporting the magazine on the cart.

Cart 62 also includes means for shifting the track assembly vertically to position a magazine supported on the assembly at selected pallet-loading positions. The shifting means, which is illustrated best in FIGS. 1 and 4, is a work-screw drive mechanism in which a hand crank 94 is used to rotate a pair of worm-drive screws 96, 98, which are rotatably mounted between frame members 90, 92, and threadedly received in plates 76, 78, respectively. As seen best in FIG. 4, the hand crank is coupled through a differential 100 to a sprocket 102, and this sprocket is connected to sprockets 104, 106 on screws 96, 98, respectively, by a chain 108. The differential and sprocket gearing is such that a single revolution of crank 94 moves plates 76 and 78 a distance corresponding to the distance between adjacent tray supports in magazine 45, with such supported on track assembly 74.

The pallets are loaded onto magazine 45 by a carriage 110 forming part of cart 62. The carriage, which is illustrated particularly in FIGS. 1, 5, and 7, includes a rectangular frame 112 constructed to support a pallet, such as pallet 114, at a defined position on its upper surface. To this end, the carriage has a number of pads, such as pads 116, 117, which hold the pallet, a front stop 118 which receives the front edge portion of a pallet in a notch 119 and a pair of rear guides, such as guide 120, which act to center the pallet at its trailing edge.

The carriage is slidably mounted on a pair of elongate tubes 124, 126 extending substantially along the length of the cart and secured to the frame as indicated in FIG. 1 and 5. Mounting blocks, such as block 216, attached to the lower corner regions of the carriage and slidably receiving the mounting tubes allow horizontal carriage sliding between a loading position, shown in the figures, and a stacking position at which the carriage is moved fully to the right in FIGS. 1 and 4, to position a pallet on the carriage for loading into magazine 45, as will be described.

Completing the description of cart 62, there is provided a transfer track assembly, or means, for transferring the magazine from the cart to the track assembly mounted within chamber 16, when the cart is moved to a loading position with respect to the apparatus. The transfer track assembly, indicated generally at 127, is seen best in FIGS. 1, 5, and 6. A pair of tracks 128, 130 in the assembly are rigidly mounted on an upper portion of the cart frame, as shown, at the same height as tracks 48, 50 of the chamber track assembly. The tracks have beveled track edges, such as edge 132, extending along inner and upper track sides, as seen particularly in FIG. 6, and these edges are constructed and dimensioned to provide a continuous track edge with the edges of tracks 80, 82, when the cart track assembly is raised to an off-load position shown in FIGS. 1 and 6. Similarly, the track edges in the transfer track assembly are constructed and dimensioned to provide a continuous edge with the edges of tracks 48, 50, when the cart is moved to a position adjacent the front of the load-in chamber, for transferring a magazine on the cart into the chamber. The transfer assembly further includes a pair of guide bars 134 (FIGS. 1 and 5) and 136 (FIG. 6) which are provided with rotatable wheels, such as wheels 138, which act to hold the magazine in a centered, stabilized position when the magazine is moved across tracks 128, 130.

The front ends of tracks 128, 130 have pins, such as pin 140 in track 130, which are adapted to be received in the corresponding openings in the chamber track assembly, such as opening 49 in track 48, to facilitate alignment between the two track assemblies when the cart is moved to its magazine-transfer position. Similarly, openings, such as opening 142 in guide bar 136, are adapted to receive the corresponding pins on the transfer track assembly guide bars, such as pin 59 in guide bar 58, also to facilitate such track assembly alignment. The alignment pins and opening in the two track assemblies are also referred to herein, collectively, as alignment means.

As mentioned above, apparatus 10 has a load-out chamber in which the processed pallets are stored in a vertically stacked configuration until all of the pallets have been processed. The load-out chamber of a conventional apparatus, i.e., a commercially supplied apparatus, is equipped with a magazine, like magazine 20', and a magazine-shifting mechanism, like the worm drive mechanism described with respect to the load-in chamber, for raising and lowering the magazine during operation of the apparatus. Briefly, the magazine is positioned initially at a lowered position for receiving the first processed pallet in the top pallet support in the magazine, and then raised progressively during operation, to place the processed pallets in successively lower pallet supports until the final pallet is received in the bottom of the magazine.

In the present invention, the load-out chamber is preferably modified substantially as described for the load-in chamber, by replacing the existing magazine with a load-out chamber track assembly which is operatively connected to the vertical drive mechanism in the chamber, and which is constructed to support a magazine, such as magazine 145, seen in the background in FIG. 1, removably in the chamber. Magazine 145 is substantially identical to above-described magazine 45. The track assembly, which is substantially identical that in chamber 16, is indicated in dotted lines at 142 in FIG. 1. The worm drive mechanism which is operable to shift the assembly vertically is indicated at 144. As in the load-in chamber, the track assembly and the removable magazine which is supported by the assembly are part of the pallet-transfer system of the invention, rather than part of the sputtering apparatus itself.

FIG. 1 also shows a second movable cart 146 which is intended for use in removing a magazine, such as magazine 145, from the load-out chamber after a sputtering operation. The cart is composed of a movable frame 148 and a transfer track assembly, indicated generally at 150. The assembly is substantially like that of transfer assembly 142 in cart 62, and includes a pair of tracks 150, 152 which are alignable with the tracks forming the chamber transfer assembly. the second cart may also be used for removing the empty magazine from the load-in chamber of the apparatus, before reloading the apparatus with a freshly loaded magazine.

Describing the operation of the system, cart 62 is readied for a pallet-loading operation by placing an empty magazine, such as magazine 45, in a loading position on the cart. This is done by using crank 94 to shift tracks 80, 82 into registry with tracks 128, 130, respectively, rolling the magazine onto tracks 80, 82, and locking the magazine in a loading position by engaging hook 81 (FIG. 6) with the magazine. The magazine is now lowered, again by hand crank 94, to position the magazine for receiving a pallet carried on carriage 110 between the top pallet support (designated 154 in FIG. 4) and the magazine surfaces 156, 157 immediately above this support. This magazine position is referred to as the first pallet-receiving position.

A pallet which is representative of the pallets to be loaded in the magazine is shown at 158 in FIG. 1. Typically, the pallet is an aluminum sheet having a thickness of about $\frac{1}{8}$ inch. The pallet is provided with a plurality of openings, such as opening 160 seen cross-sectionally in FIG. 8, each constructed and dimensioned to hold a substrate such as substrate 162 in the manner indicated in FIG. 8, with substantially both sides of the substrate being accessible for deposition. The pallet is placed on the carriage, with such in its loading position, using guides, such as guide 120, to center the pallet, and then shifting the pallet longitudinally, if necessary, to bring the front edge of the pallet into the notch in stop 118. The substrates may be placed on the pallet either before or after pallet placement on the carriage.

With the magazine in its first insertion position, the carriage is now shifted in a left-to-right direction in FIGS. 1 and 5, to its loading position, at which the pallet on the carriage is received between magazine supports. As indicated above, the relative vertical position of the pallet on the carriage and the magazine allows the pallet to pass freely between support 154 and surfaces 156 and 157 without frictional contact. With the carriage moved to its loading position, the magazine is then raised, by turning crank 94 one revolution, to place the magazine in position for receiving the next pallet. This position is referred to as the second loading position of the magazine. As the magazine is raised to its second insertion position, support 154 is brought against the side edges of pallet 154, transferring the pallet from the carriage to support 156. The relative magazine position at which such transfer occurs is also referred to herein as a release position, since the carriage is then released for return to its loading position without the pallet. In this manner, the pallet is placed on support 154 without frictional sliding contact between the pallet and the support.

The carriage is now returned to its loading position, a new pallet with substrates placed on the pallet, and the pallet moved once again to its stacking position within magazine 45. With the magazine in its second loading position, the pallet on the carriage moves freely between the support 154 and the support immediately below. Another turn of crank 94 transfers the second pallet from the carriage to the second tray support in the magazine and places the magazine at a third insertion position at which the magazine can accept a third pallet in the same fashion. FIG. 4 shows the position of magazine 45 on the cart when a pallet 69 is being loaded onto support 68 by carriage 110. The figure shows the clearance between the pallet edges and the projections forming supports 66, 68. The pallet load and transfer operations are continued in this manner until the entire magazine or a selected number of supports thereon are filled.

It should be noted that the magazine loading operations just described are preferably performed while apparatus 10 is in operation, so that at the end of the sputtering cycle, the freshly filled magazine will be ready for loading into the load-in chamber after removing the spent magazine in the chamber. The spent magazine can be removed by hand or, if desired, by transfer onto a cart, such as cart 62 or cart 146. At the same time, the filled magazine in the out-load chamber can be removed, such as by transfer onto cart 146, and replaced by an empty magazine, such as the one just removed from the load-in chamber. It is also noted that the pallet-loading operation is readily robotized, in part or totally, by providing automatic in-feed of loaded pallets onto the carriage 110, and automatic vertical shifting of the magazine and horizontal shifting of the carriage, in accordance with the loading procedure described above.

To reload the apparatus with fresh pallets, cart 62 having the freshly loaded magazine is moved toward the front of the open load-in chamber until the track alignment means in the transfer and track assemblies are engaged to align the two assemblies. With the magazine stop now released, and the cart transfer assembly raised to a position of track registry with the transfer assembly, the magazine is rolled along the continuous track into the load-in chamber. The cart is then removed and the chamber resealed for another operation. The entire load/unload procedure, involving replacing the loaded cart in the load-out chamber with an empty magazine, and the empty magazine in the load in chamber with a preloaded one, can be performed readily in five minutes or less. Readying the apparatus for the next sputtering cycle, requiring pumping down the apparatus to about $10^{-7}$ Torr. requires typically another 20 to 30 minutes.

From the foregoing, it can be appreciated how various objects and features of the invention are met. One important advantage of the system is the increased speed in unloading and loading a sputtering apparatus between operations. Heretofore, such loading and unloading involved individually transferring pallets into or out of the apparatus. As indicated above, this procedure and the attendant vacuum pump down time typically requires 50–100% of the total functioning time of the apparatus and thus significantly reduces machine output. With the present invention, the pallets are removed and replaced as a group on preloaded magazines. The time-saving in pallet loading also decreases the vacuum pump down time after loading, because less moisture has penetrated into the apparatus during loading. The total down time between sputtering cycles is reduced typically to 10–20 minutes, rather than the 1–2 hours previously required.

Another advantage of the invention is reduced metal debris in the apparatus. As noted above, such debris, which is generated by frictional contact between pallets and magazine, can seriously impair the recording characteristics of and thin-film medium, usually requiring that the medium be discarded. In the present invention, metal debris is reduced, in part, because pallet loading and unloading is performed outside of the apparatus, and more importantly, because the pallet loading feature of the invention avoids sliding frictional contact between the pallets being loaded and the magazine.

While a preferred embodiment of the invention has been described herein, it will be apparent to those in the art that various changes and modifications may be made without departing from the invention.

It is claimed:

1. A rapid-load system for loading a series of trays into a plating apparatus of the type having a load-in chamber for receiving a plurality of vertically stacked pallets and a conveyor for successively engaging each of the stacked pallets in the load-in chamber and carrying the engaged pallets through a plating region where one or more substrates supported on the tray are plated under vacuum conditions, said system comprising:

a load-in magazine having a plurality of vertically spaced pallet supports, where each support includes a pair of confronting, inwardly projecting support surfaces on the opposite side walls of the magazine, for engaging opposite side edges of a pallet, and the space immediately above each support is sufficient to allow insertion of a pallet into the magazine directly above the support, without contact between the tray and the associated support, structure within the load-in chamber of the plating apparatus, for removably supporting said magazine, and a movable loading cart having (a) a shiftable carriage adapted to move a pallet supported on the carriage between loading and stacking positions, (b) means for supporting the magazine on the cart, (c) means for shifting the supporting means vertically with respect to said shiftable carriage, to place said magazine, when supported on the support means, at each of a series of the insertion positions where a pallet supported on the carriage can be received in the space immediately above a selected pallet support, without contact between the tray and the magazine, as the carriage is shifted from its loading to its stacking positions, and a corresponding release positions, where the inserted pallet is lowered with respect to the magazine, to transfer support of the pallet from the carriage to that support, and (d) transfer means for transferring the magazine from the supporting means on the cart to the structure within the load-in chamber of the plating apparatus, with the cart positioned adjacent such load-in chamber.

2. The system of claim 1, wherein said supporting means is mounted for vertical shifting between raised and lowered positions, and said shifting means is operable to shift said support means to such vertically shifted insertion and release positions.

3. The system of claim 2, wherein said support means includes a support track assembly, and said shifting means includes a drive system having a worm screw drive mechanism operatively connected to the track assembly.

4. The system of claim 1, wherein said support structure includes a chamber track assembly mounted within such load-in chamber, said transfer means includes a transfer track assembly mounted on the cart and alignable adjacent such load-in chamber, and the system further includes roller means for rolling the magazine from the support means across the transfer track assembly onto the chamber track assembly.

5. The system of claim 4, which further includes alignment members in said track assemblies for aligning the two assemblies when the cart is positioned adjacent such load-in chamber.

6. The system of claim 1, for use in such a plating apparatus that also includes a load-out chamber in which the pallets as stored in a vertical stack after plating, which further includes a load-out magazine, and load-out support structure mounted within the load-out chamber for removably supporting said load-out magazine.

7. The system of claim 6, which further includes a second movable cart having magazine-support structure which is alignable with the support structure in the load-out chamber, for receiving the loaded magazine from the load-out chamber.

* * * * *